United States Patent
Hillstrom et al.

(10) Patent No.: US 9,549,477 B2
(45) Date of Patent: Jan. 17, 2017

(54) HOUSING FOR ELECTRONIC COMPONENTS

(75) Inventors: Per Hillstrom, Molnlycke (SE); Mikael Fardig, Lindome (SE); Daniel Fredriksson, Jorlanda (SE); Sofia Olsson, Goteborg (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 198 days.

(21) Appl. No.: 14/380,723

(22) PCT Filed: Feb. 28, 2012

(86) PCT No.: PCT/EP2012/053339
§ 371 (c)(1),
(2), (4) Date: Aug. 24, 2014

(87) PCT Pub. No.: WO2013/127434
PCT Pub. Date: Sep. 6, 2013

(65) Prior Publication Data
US 2015/0021066 A1    Jan. 22, 2015

(51) Int. Cl.
*H05K 5/00* (2006.01)
*H05K 5/02* (2006.01)
(Continued)

(52) U.S. Cl.
CPC .......... *H05K 5/0213* (2013.01); *B32B 38/0012* (2013.01); *H05K 5/061* (2013.01);
(Continued)

(58) Field of Classification Search
CPC .......... H02G 3/08; H02G 3/081; H02G 3/086; H02G 3/088; H05K 5/00; H05K 5/061; H05K 5/06; H05K 5/0213; H05K 9/0018; H05K 5/02; H05K 9/0007; H05K 9/0015; H05K 5/03; B32B 38/0012; B32B 2457/00; B32B 2439/40; B60R 16/0238; B60R 16/0239
(Continued)

(56) References Cited

U.S. PATENT DOCUMENTS 4,609,126 A * 9/1986 Janda .................. H05K 5/03
174/16.1
5,159,155 A   10/1992 Nishihara
(Continued)

OTHER PUBLICATIONS

PCT International Search Report, mailed Sep. 21, 2012, in connection with International Application No. PCT/EP2012/053339.

*Primary Examiner* — Angel R Estrada
(74) *Attorney, Agent, or Firm* — Leffler Intellectual Property Law, PLLC (57) ABSTRACT

The invention relates to a housing for electronic components with the housing comprising at least a front housing part and a rear housing part. The front housing part and the rear housing part are arranged to be sealed by means of a sealing gasket upon attaching the front housing part to the rear housing part. The housing comprises at least one ventilation opening to prevent build-up of negative pressure inside the housing, where the ventilation opening is covered by a protective covering comprising a through opening. The through opening is arranged to allow water to flow through the through opening, thereby preventing a build up of pressure inside the protective covering. A method for manufacturing a housing according to the invention is also disclosed.

12 Claims, 5 Drawing Sheets

(51) Int. Cl.
  *B32B 38/00*     (2006.01)
  *H05K 5/06*      (2006.01)
  *H05K 9/00*      (2006.01)

(52) U.S. Cl.
  CPC ........ *H05K 9/0018* (2013.01); *B32B 2439/40* (2013.01); *B32B 2457/00* (2013.01)

(58) Field of Classification Search
  USPC ................ 174/50, 50.5, 520, 559, 560, 564; 220/3.2–3.9, 4.02; 361/600, 601, 641; 439/76.1, 76.2
  See application file for complete search history.

(56) References Cited

U.S. PATENT DOCUMENTS

| | | | |
|---|---|---|---|
| 5,823,378 A | 10/1998 | Evarts et al. | |
| 6,319,057 B2* | 11/2001 | Sekido | .......................... 439/76.1 |
| 6,492,589 B1 | 12/2002 | Smith | |
| 7,253,356 B2* | 8/2007 | Kiyota | .................. H02G 3/081 |
| | | | 174/50 |
| 7,671,275 B2* | 3/2010 | Kubota | .............. H01R 13/5227 |
| | | | 174/50 |
| 8,210,378 B2* | 7/2012 | Takeuchi | ............... H02G 3/088 |
| | | | 220/4.02 |
| 8,420,931 B2* | 4/2013 | Soh | .................... B60R 16/0238 |
| | | | 174/50 |
| 9,142,944 B2* | 9/2015 | Makino | .................. H02G 3/088 |
| 9,190,818 B2* | 11/2015 | Shiraki | ................. H02G 3/088 |
| 2009/0011839 A1 | 1/2009 | Cole | |
| 2010/0230128 A1 | 9/2010 | Aburaya et al. | |

\* cited by examiner

HOUSING FOR ELECTRONIC COMPONENTS

TECHNICAL FIELD

The present invention relates to a housing for electronic components. The housing comprises at least a front housing part and a rear housing part. The front housing part and the rear housing part is arranged to be sealed by means of a sealing gasket upon attaching the front housing part to the rear housing part. The housing comprises at least one ventilation opening to prevent build-up of negative pressure inside the housing.

BACKGROUND ART

Outdoor units for housing standard electronic components inside are well known from the art. An outdoor housing must be weatherproof so that no water intrusion can occur. This can be indicated by that the housing fulfills an Ingress Protection Rating of for instance IP X5 according to the International Electrotechnical Commission standard IEC 60529. Weatherproofing is normally done by using a rubber gasket or similar to seal the parts of the housing. However if a unit is completely air tight with no ventilation, heavy rain can give rise to negative pressure inside the unit. This is due to the fact that the heated air inside the unit will cool down rapidly during rain causing the pressure inside to drop. The suction force of the negative pressure can be of such magnitude that water can pass the gaskets leading to that the electronic components are subjected to water. This may give rise to malfunctions of the electronic components.

The solution to this problem is to make a ventilation opening for pressure equalization in order to equalize any negative pressure that arises. The pressure equalization must however be done rather quickly in order to avoid build up of negative pressure inside the unit. One existing solution is to use a water tight membrane such as Gore-Tex® to hinder water from entering the ventilation opening. The pressure equalization in these products are slow leading to that negative pressure may be present long enough for water intrusion to occur.

There is thus a need for an improved housing for electronic components where the above mentioned problems are at least partly avoided.

SUMMARY OF INVENTION

The object of the present invention is to provide a housing for electronic components where the previously mentioned problems are at least partly avoided.

The present invention relates to a housing for electronic components where the housing comprises at least a front housing part and a rear housing part, the front housing part and the rear housing part being arranged to be sealed by means of a sealing gasket upon attaching the front housing part to the rear housing part; the housing comprising at least one ventilation opening to prevent build-up of negative pressure inside the housing, where the ventilation opening is covered by a protective covering comprising a through opening, where the through opening is arranged to allow water to flow through the through opening, thereby preventing a build up of water pressure inside the protective covering.

One advantage with the invention is that the ventilation hole is covered by a protective covering comprising a through opening. The through opening allows a free flow of water through the protective covering in order to avoid water pressure build-up. A build-up of water pressure could otherwise cause water intrusion through the ventilation hole. By having a protective covering shielding the ventilation opening the ventilation opening may be designed such that pressure equalization can occur much faster than in prior art, thereby greatly reducing the risk of water intrusion due to build-up of negative pressure in the housing.

The protective covering may be installed on the front housing part or the rear housing part. The ventilation opening may be integrated in the one of the housing parts or may be made separately and be adapted to be mounted onto one of the housing parts.

The ventilation opening may comprise an inner hole extending from the interior of the housing into an outer hole, the outer hole extending from the inner hole to atmosphere; the outer hole having a smallest cross section larger than the cross section of the inner hole.

The ventilation opening is made up of two parts, one inner hole and one outer hole. The size of the inner hole is, besides from providing rapid pressure equalization, chosen to minimize leakage of electromagnetic interference (EMI) and insect intrusion. The inner hole, the outer hole or the entire ventilation opening may be of different shapes such as for instance cylindrical, frusto-conical or thimble shaped or any other suitable shape. The inner and the outer hole may be made up of different shapes. If the inner hole is not cylindrical the smallest cross section of the outer hole is larger than the largest cross section of the inner hole. The cross section of the outer hole is chosen such that formation of hanging water drops in the ventilation opening is avoided.

The protective covering may have a length and cross section such that the ventilation opening is prevented from being directly hit by water projected by a nozzle.

This allows for a housing to be installed in such areas where cleaning of the housing may be necessary or where heavy rainfall similar to water projected by a nozzle could enter the ventilation opening.

The dimensions of the inner hole may be adapted to prevent leakage out of the housing of microwave radiation emanating from the electronic components.

Depending on the type of electronic components installed in the housing different kinds of radiation are produced by the components. Some components used produce microwave radiation. The dimensions of the inner hole such as diameter and length may be adapted to prevent this radiation from leaking out of the housing. The inner hole also prevents insect intrusion. Typical dimensions of the inner hole are between 1 mm and 10 mm in length and 1 mm and 4 mm in diameter.

The diameter of the outer hole may be between 6 and 12 mm, length between 4 and 20 mm. As stated above, this is to reduce the build-up of hanging water drops in the ventilation opening.

An end of the outer hole of the ventilation opening may lie flush against a side of the front housing part or the rear housing part.

This means that no part of the ventilation opening protrudes into the through opening of the protective covering.

The outer hole of the ventilation opening may protrude out of the front housing part or rear housing part forming a protective barrier for the ventilation opening.

By having the outer hole of the ventilation opening form a protective barrier the inner hole of the ventilation opening is further protected against water reaching it when passing through the through opening of the protective covering.

The through opening of the protective covering may comprises at least one of the following cross sections: square, rectangular, circular, triangular, heptagonal, hexagonal, quadrilateral or oval.

As stated above one purpose of the protective covering and the through opening is to protect the ventilation opening from being hit directly by water and that a build-up of water pressure is avoided. By having a through opening that comprises a cross section made up of one or more of the above geometrical shapes the protective covering may be designed for a number of specific designs of housing while still allowing water to flow through the through opening.

The protective covering may be integrated into the housing.

One advantage with having the protective covering integrated into the housing is that the protective covering is designed with the rest of the front housing part or the rear housing part such that no additional machining or mounting of additional components is required after production of the housing parts.

The protective covering may be separate from the housing and is arranged to be attached to the housing such that it covers the ventilation opening.

One advantage with having the protective covering being made separate from the housing parts is that this allows for more optimization of the protective covering.

As stated above the ventilation opening may be integrated in the housing or it may be designed as a part separate from the housing. Any combination of a separated or integrated ventilation opening and separated or integrated protective covering is possible. Alternatively the protective covering may be joined with at least the outer hole of the ventilation opening forming a protective ventilation unit. This entire unit may then be mounted to the housing for instance by having an outer thread on the outer hole with a matching thread on the housing, by having a snap in attachment or by any other suitable means of attachment.

The protective covering may be arranged to cover the ventilation opening such that the housing fulfils the Ingress Protection Rating IP X6 or IPX5 of the International Electrotechnical Commission standard IEC 60529.

The protective covering may be designed such that the housing fulfils the Ingress Protection Rating IP 55 according to the Electrotechnical Commission standard IEC 60529. In short this means that ingress of dust into the housing is not entirely prevented, but it must not enter in sufficient quantity to interfere with the satisfactory operation of the equipment. Components inside the housing are protected against contact. A water jet projected by a nozzle (6.3 mm) against enclosure from any direction shall have no harmful effects. The housing itself is designed such that IP 55 is fulfilled.

The housing may be designed such that the Ingress Protection Rating IPX5 or IPX6 is fulfilled. This means that primarily the intrusion of water is taken into account when designing the housing. The level of protection against intrusion of dust can be modified to fit the intended environment where the housing is to be mounted.

The at least one ventilation opening may comprise more than one inner hole.

In order to achieve the desired pressure equalization of the housing the ventilation opening may be designed in a number of different ways. More than one inner hole may be present in the ventilation opening. This may be necessary in order to increase the area that extends from the interior of the housing into the outer hole for better pressure equalization. Done in this way the intrusion requirements are not jeopardized and the leakage of EMI is not increased.

The invention further relates to a method for manufacturing a housing where the method comprises:
  manufacturing the protective covering as an integral part of either the front housing part or the rear housing part during the manufacturing of the front housing part or the rear housing part.

As stated above, this leads to a simplified manufacturing of the housing which requires no additional machining. Another possibility is to have half of the protective covering as part of the front housing part and half of the protective covering as part of the rear housing part. It is of course possible to have other ratios between the parts of the protective covering that are parts of either the front housing part or the rear housing part.

The method may further comprise:
  manufacturing the front housing part and the rear housing part using a die cast method.

This allows for the housing to be manufactured in large volumes with great dimensional accuracy, smooth surfaces and inserts to be cast-in.

DETAILED DESCRIPTION OF DRAWINGS

Figure 1:
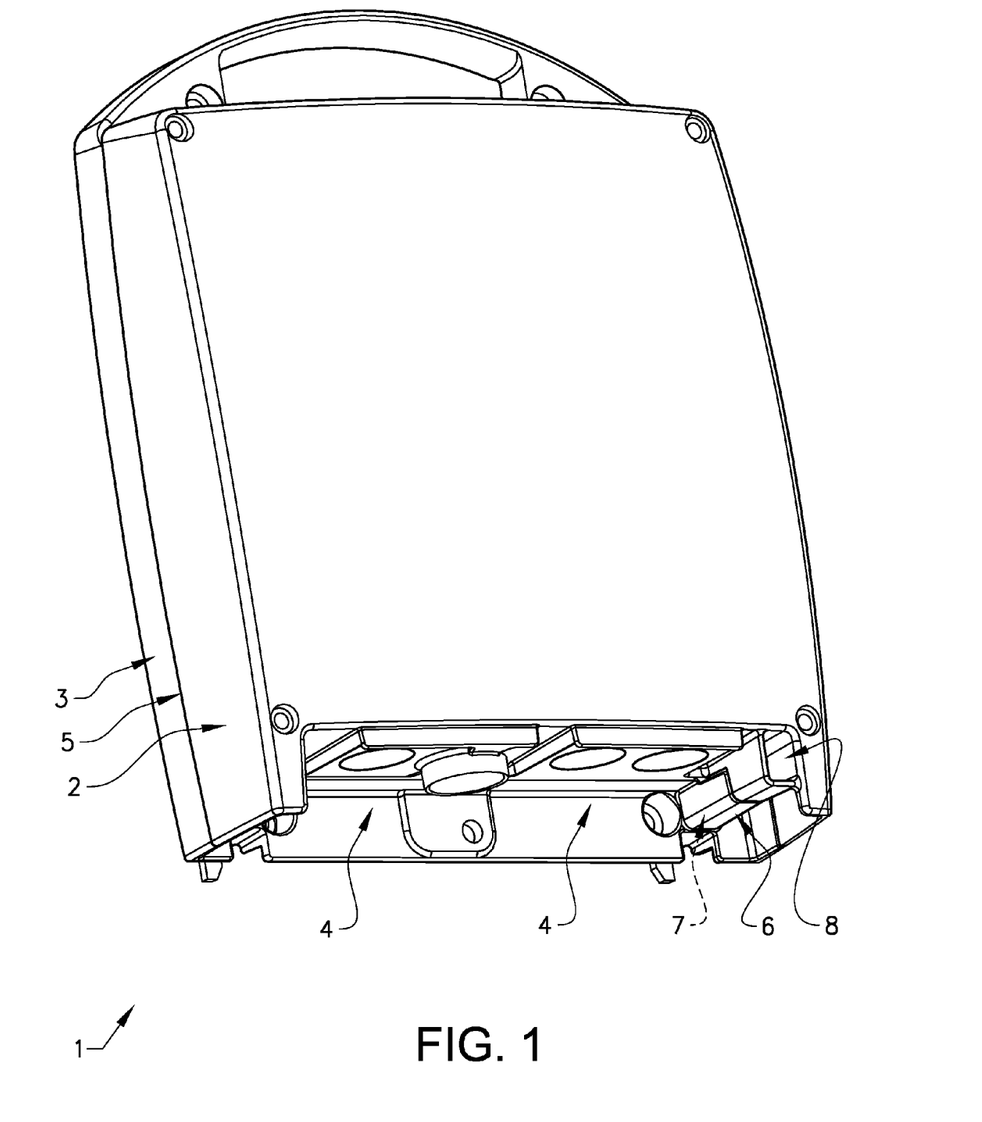
FIG. 1 schematically illustrates a perspective view of a housing according to the invention, FIG. 2 schematically illustrates a detail view of the protective covering of a housing according to the invention, FIG. 3 schematically illustrates a detail view of the protective covering of a housing according to the invention, FIG. 4 schematically illustrates a detail view of the through opening of the protective covering, FIG. 5 schematically illustrates an alternative protective covering for a housing according to the invention.

FIG. 1 schematically illustrates a perspective view of a housing 1 according to the invention. The housing 1 comprises a front housing part 2 and a rear housing part 3. The housing 1 may comprise additional housing parts if needed, located either inside or outside of the housing 1. The housing 1 comprises a number of cable connections 4 for connecting cables to electronic components located inside the housing 1. The housing 1 further comprises a sealing gasket 5 for creating a seal between the front housing part 2 and the rear housing part 3 upon attaching the front housing part 2 to the rear housing part 3. The front housing part 2 and the rear housing part 3 are attached to each other using known attachment means. The housing 1 is arranged to be attached to for instance a mast, a roof, a side of a building, a tripod, a metal profile or similar by means known in the art.

The housing 1 further comprises a protective covering 6 covering a ventilation opening 7 (not shown in FIG. 1) intended to equalize the pressure between atmosphere and the interior of the housing 1. In FIG. 1 the protective covering 6 has an essentially rectangular shape and extends from a front wall of the front housing part 2 to a rear wall of the rear housing part 3. The protective covering 6 may have a different shape from the one shown in FIG. 1. The protective covering 6 does not have to extend all the way from the front to the rear of the housing 1. The protective covering 6 comprises a through opening 8 allowing water to flow through the through opening 8, thereby preventing a build up of pressure inside the protective covering 6.

Figure 2:
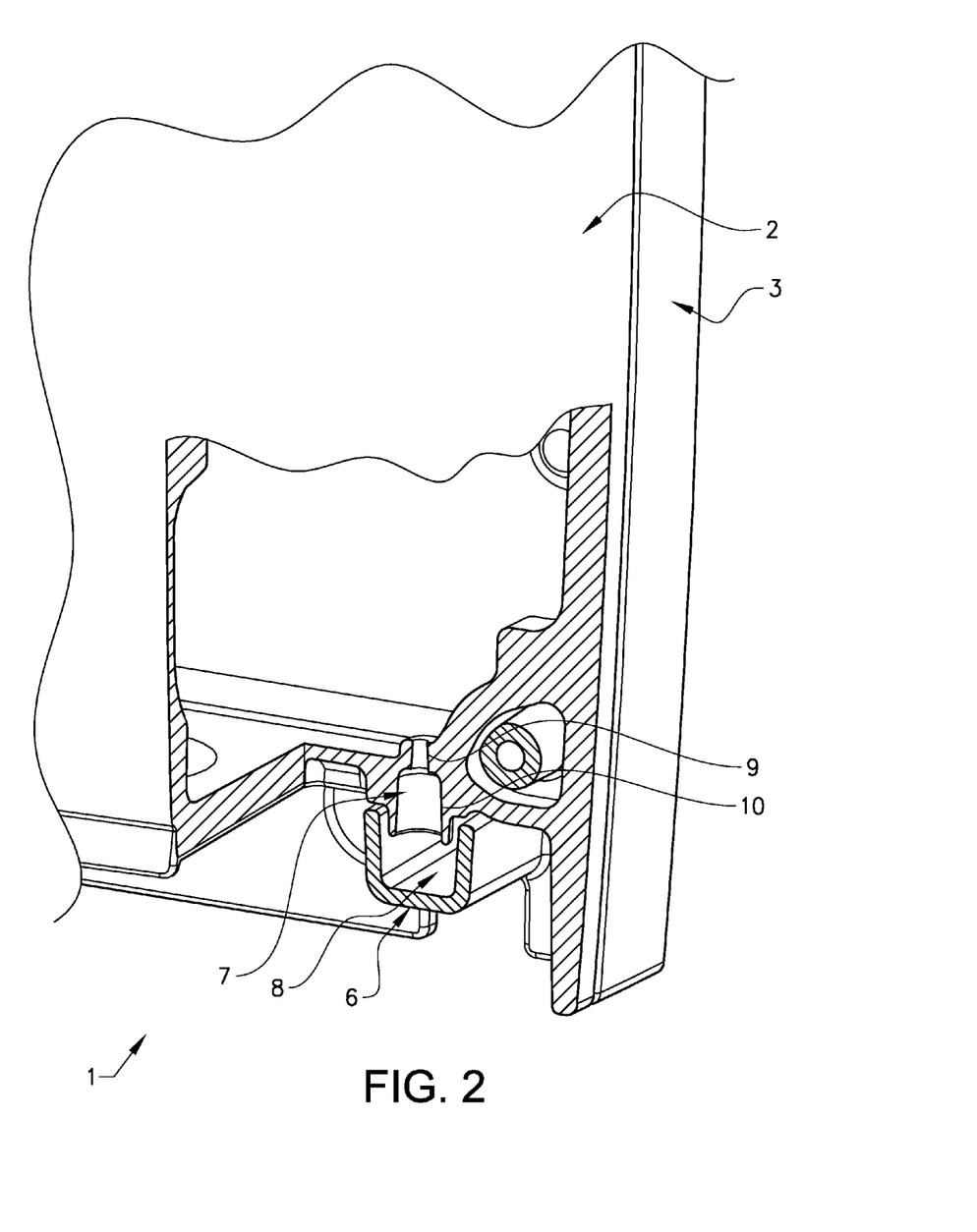

FIG. 2 schematically illustrates a detail view of the protective covering 6 of a housing 1 according to the invention. In FIG. 2 the lower right corner of the housing 1 is cut out in order to show the protective covering 6 and the ventilation opening 7. As can be seen the ventilation opening 7 comprises an inner hole 9 and an outer hole 10. The inner hole 9 extends from the interior of the housing 1 into the outer hole 10. The outer hole 10 extends from the inner hole 9 to the outside atmosphere thereby creating a ventilation opening 7 that extends from the interior of the housing 1 to the outside atmosphere.

The outer hole 10 has a smallest cross section larger than the cross section of the inner hole 9 that connects the inner hole 9 to the outer hole 10. This relation between the cross sections exists so that the inner hole 9 protects the interior from dust intrusion and prevents or reduces electromagnetic leakage from the housing 1 while the outer hole 10 prevents build up of hanging drops of water in the ventilation opening 7. At the same time the ventilation opening 7 achieves the intended pressure equalization. The shape of the inner hole 9 and the outer hole 10 may vary as long as the above described relation between the cross sections is kept. It is also possible for the ventilation opening 7 to comprise more than an inner hole 9 and an outer hole 10. One or more intermediate holes may be present in the ventilation opening 7. The relation between the cross section of the inner hole 9 and the cross section of the outer hole 10 must however be preserved. It is also possible for the ventilation opening 7 to be frusto-conical meaning that the ventilation opening 7 is made up of just one continuous opening tapering off from the desired cross section of the outermost part (corresponding to the cross section of the outer hole above) towards the desired cross section of the innermost part (corresponding to the cross section of the inner hole above).

Figure 3:
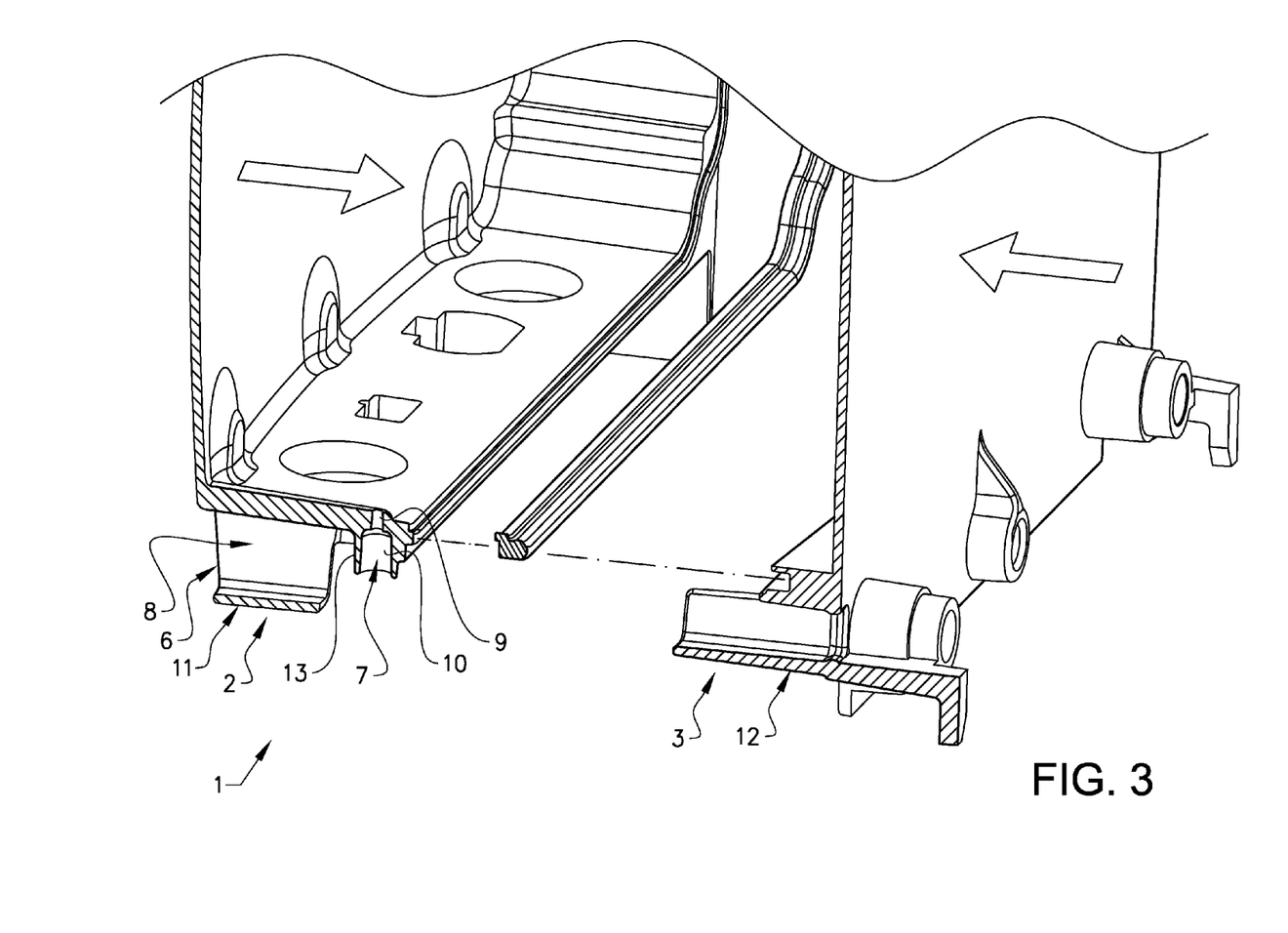

FIG. 3 schematically illustrates a detail side view of the protective covering 6 of a housing 1 according to the invention. In FIG. 3 the housing 1 is shown in an exploded view in order to better see how the front housing part 2 and the rear housing part 3 interact to form the protective covering 6. In FIG. 3 the ventilation opening 7 is located on the front housing part 2. As can be seen from FIG. 3 the protective covering 6 is formed by that the protective covering 6 comprises a first covering part 11 located on the front housing part 2 and a second covering part 12 located on the rear housing part 3. The first covering part 11 does not extend all the way leaving the ventilation opening 7 uncovered when the front housing part 2 and the rear housing part 3 are separated. The second covering part 12 has an extension such that when the front housing part 2 and the rear housing part 3 are attached the second covering part 12 abuts the first covering part 11 thereby forming a complete protective covering 6 comprising a through opening 8. The length of the first covering part 11 and the second covering part 12 may be adjusted to any lengths as long as the ventilation opening 7 is covered by the protective covering 6.

The first covering part 11 may of course be located on the rear housing part 3 while the second covering part 12 may be located on the front housing part 2. The ventilation opening 7 is then moved to the rear housing part 3.

Figure 4:
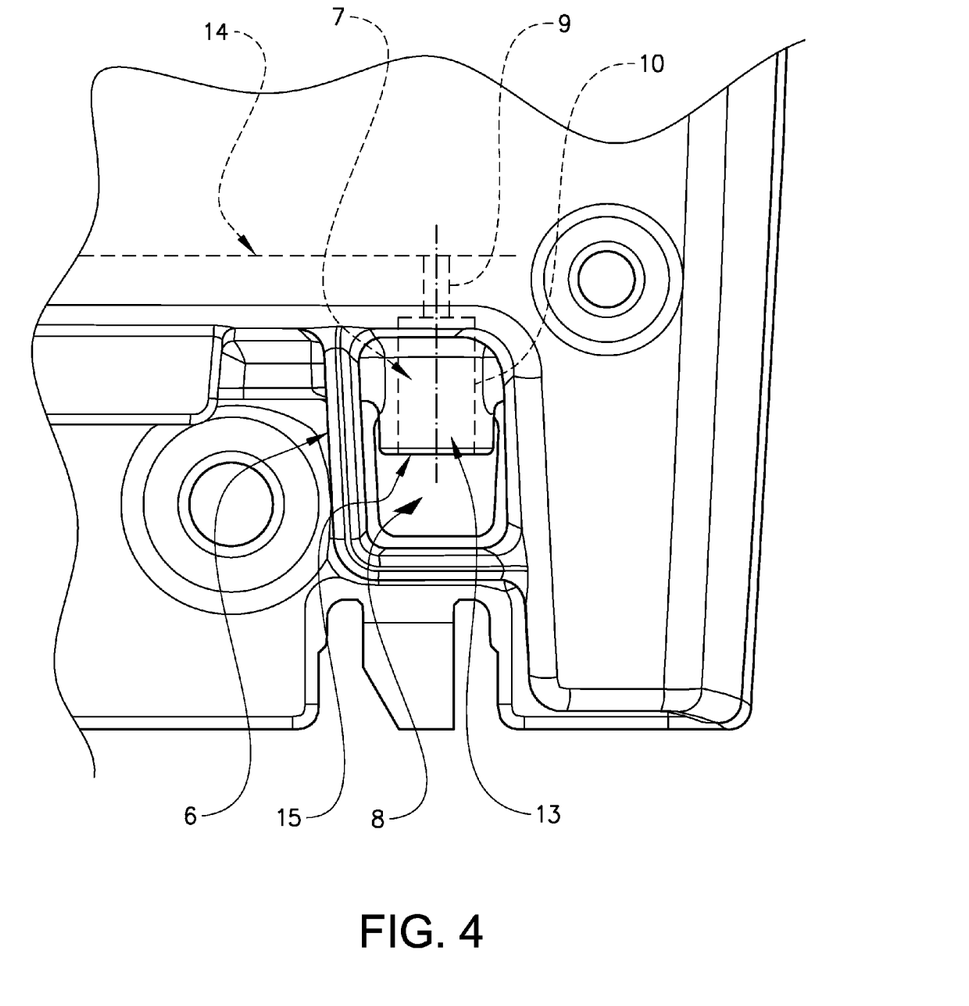

FIG. 4 schematically illustrates a detail view of the through opening 8 of the protective covering. In FIG. 4 it is shown that the protective covering 6 forms a through opening 8. The ventilation opening 7 is also shown with the inner hole 9 and outer hole 10 being marked by dashed lines. The bottom 14 of the interior of the housing 1 is also shown by a dashed line.

As can be seen from FIGS. 3 and 4 an end 15 of the ventilation opening 7 protrudes a distance into the through opening 8. This makes an outer surface 13 of the outer hole 10 function as a protective barrier that diverts any water that enters the through opening 8 of the protective covering 6 and protects the ventilation opening 7 from water entering the ventilation opening 7.

Figure 5:
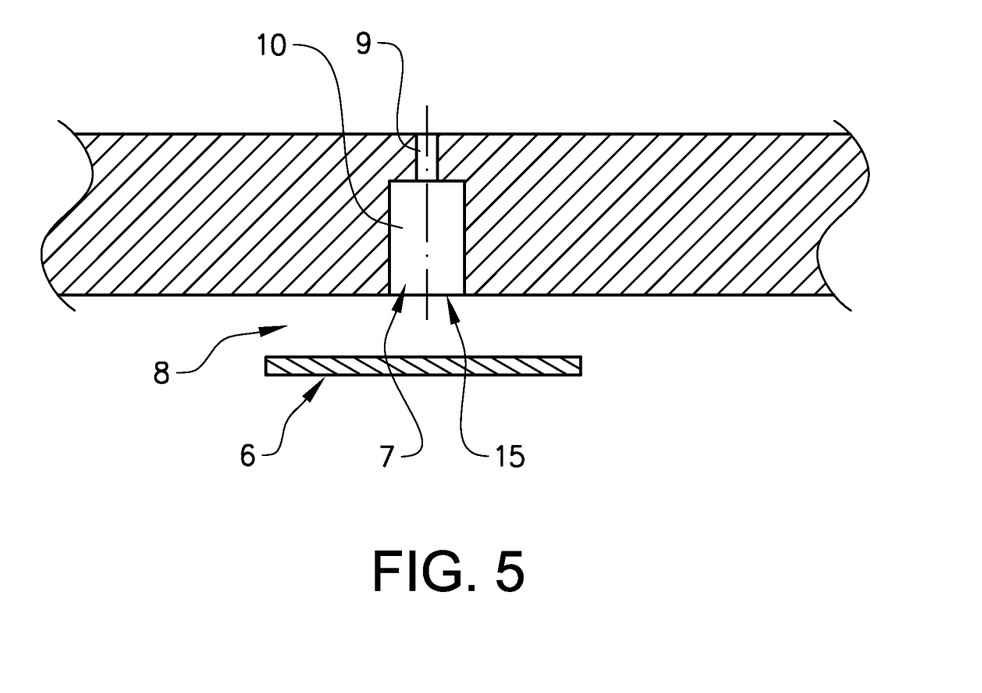

FIG. 5 schematically illustrates an alternative protective covering 6 for a housing 1 according to the invention. In FIG. 5 the protective covering 6 is shown having a simple shape. The protective covering 6 in FIG. 5 is merely a lid-type cover attached to the housing 1. As stated above the protective covering can take on a number of shapes, as long as at least one through opening 8 is present allowing water to flow through the through opening 8 to prevent a build up of pressure inside the protective covering 6 and protect the ventilation opening 7 from being hit directly by a water jet as stated above.

In FIG. 5 an alternative design for the ventilation opening 7 is also illustrated. As can be seen the end 15 of the outer hole 10 of the ventilation opening 7 lies flush against a side of the front housing part 2 or the rear housing part 3. This design of ventilation opening 7 may be combined with any design of the protective covering 6 as can the design of the ventilation opening 7 as described in conjunction with FIGS. 2-4.

Reference signs mentioned in the claims should not be seen as limiting the extent of the matter protected by the claims, and their sole function is to make claims easier to understand.

As will be realised, the invention is capable of modification in various obvious respects, all without departing from the scope of the appended claims. Accordingly, the drawings and the description thereto are to be regarded as illustrative in nature, and not restrictive. For instance, the ventilation opening with its protective covering does not have to be placed on the bottom of the housing but can instead be placed on any side of the housing as long as the interior of the housing is connected with atmosphere via the inner hole and the outer hole. The bottom of the housing also does not need to be straight as shown in FIG. 4 but may be adapted to different shapes depending on for instance the location and design of the ventilation opening and the intended contents of the housing.

The invention claimed is:

1. A housing for electronic components, the housing comprising at least a front housing part and a rear housing part, the front housing part and the rear housing part being arranged to be sealed by means of a sealing gasket upon attaching the front housing part to the rear housing part; the housing comprising at least one ventilation opening to prevent build-up of negative pressure inside the housing, wherein the ventilation opening is covered by a protective covering comprising a through opening, where the through opening is arranged to allow water to flow through the through opening, thereby preventing a build up of pressure inside the protective covering, wherein the ventilation opening comprises an inner hole extending from the interior of the housing into an outer hole, the outer hole extending from the inner hole to atmosphere, the outer hole having a smallest cross section larger than the cross section of the inner hole.

2. The housing according to claim 1, wherein the protective covering has a length and cross section such that the ventilation opening is prevented from being directly hit by water projected by a nozzle.

3. The housing according to claim 1, wherein the dimensions of the inner hole are adapted to prevent leakage out of the housing of microwave radiation emanating from the electronic components.

4. The housing according to claim 1, wherein the diameter of the outer hole is between 8 mm and 10 mm.

5. The housing according to claim 1, wherein an end of the outer hole of the ventilation opening lies flush against a side of the front housing part or the rear housing part.

6. The housing according to claim 1, wherein the outer hole of the ventilation opening protrudes out of the front housing part or rear housing part forming a protective barrier for the ventilation opening.

7. The housing according to claim 1, wherein the through opening of the protective covering comprises at least one of the following cross sections: square, rectangular, circular, triangular, heptagonal, hexagonal, quadrilateral or oval.

8. The housing according to claim 1, wherein the protective covering is integrated into the housing.

9. The housing according to claim 1, wherein the protective covering is separate from the housing and is arranged to be attached to the housing such that it covers the ventilation opening.

10. The housing according to claim 1, wherein the at least one ventilation opening comprises more than one inner hole.

11. A method for manufacturing a housing for electronic components, the housing comprising at least a front housing part and a rear housing part, the front housing part and the rear housing part being arranged to be sealed by means of a sealing gasket upon attaching the front housing part to the rear housing part; the housing comprising at least one ventilation opening to prevent build-up of negative pressure inside the housing, wherein the ventilation opening is covered by a protective covering comprising a through opening, where the through opening is arranged to allow water to flow through the through opening, thereby preventing a build up of pressure inside the protective covering, the method comprising:
   manufacturing the protective covering as an integral part of either the front housing part or the rear housing part during the manufacturing of the front housing part or the rear housing part,
   wherein the ventilation opening comprises an inner hole extending from the interior of the housing into an outer hole, the outer hole extending from the inner hole to atmosphere, the outer hole having a smallest cross section larger than the cross section of the inner hole.

12. The method according to claim 11, further comprising:
   manufacturing the front housing part and the rear housing part using a die cast method.

* * * * *